(12) United States Patent
Ong et al.

(10) Patent No.: US 8,049,205 B2
(45) Date of Patent: *Nov. 1, 2011

(54) POLY(ALKYNYLTHIOPHENE)S AND ELECTRONIC DEVICES GENERATED THEREFROM

(75) Inventors: Beng S. Ong, Mississauga (CA); Yuning Li, Mississauga (CA); Yiliang Wu, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 830 days.

This patent is subject to a terminal disclaimer.

(21) Appl. No.: 11/398,931

(22) Filed: Apr. 6, 2006

(65) Prior Publication Data
US 2007/0235719 A1    Oct. 11, 2007

(51) Int. Cl.
*H01L 35/24* (2006.01)
*H01L 51/00* (2006.01)

(52) U.S. Cl. .................................. 257/40; 257/E51.025

(58) Field of Classification Search .............. 257/40, 257/E51.025, E51.006, E51.029; 528/373, 528/422, 380

See application file for complete search history.

(56) References Cited

U.S. PATENT DOCUMENTS

| | | | |
|---|---|---|---|
| 5,619,357 A | 4/1997 | Angelopoulos et al. | |
| 5,777,070 A | 7/1998 | Inbasekaran et al. | |
| 5,969,376 A | 10/1999 | Bao | |
| 6,107,117 A | 8/2000 | Bao et al. | |
| 6,150,191 A | 11/2000 | Bao | |
| 6,770,904 B2 | 8/2004 | Ong et al. | |
| 2004/0127592 A1* | 7/2004 | Heeney et al. | 522/6 |
| 2005/0017311 A1 | 1/2005 | Ong et al. | |
| 2006/0145148 A1* | 7/2006 | Hirai et al. | 257/40 |
| 2007/0238852 A1* | 10/2007 | Ong et al. | 528/373 |

OTHER PUBLICATIONS

See the "Cross Reference to Related Applications" on pp. 1 and 2 of the Specification Being Filed Concurrently.
Ong, Beng, et al., U.S. Appl. No. 11/011,678, filed Dec. 14, 2004 on Compound with Indolocarbazole Moieties and Devices Containing Such Compound.
Ong, Beng, et al., U.S. Appl. No. 11/167,512, filed Jun. 27, 2005 on Compound with Indolocarbazole Moieties and Devices Containing Such Compound.
Huang, D.H., et al., "Conjugated Polymers Based on Phenothiazine and Fluorene in Light-Emitting Diodes and Field Effect Transistors", *Chem. Mater.* 2004, 16, 1298-1303.
Zhu, Y., et al, "Phenoxazine-Based Conjugated Polymers: A New Class of Organic Semiconductors for Field-Effect Transistors", *Macromolecules 2005*, 38, 7983-7991.

* cited by examiner

*Primary Examiner* — Shouxiang Hu
(74) *Attorney, Agent, or Firm* — Fay Sharpe LLP

(57) ABSTRACT

An electronic device comprising a semiconductive material of Formula (I)

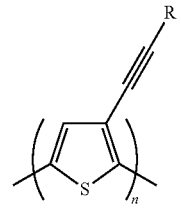

(I)

wherein R is a suitable hydrocarbon or a heteroatom containing group; and n represents the number of repeating units.

7 Claims, 2 Drawing Sheets

POLY(ALKYNYLTHIOPHENE)S AND ELECTRONIC DEVICES GENERATED THEREFROM

STATEMENT REGARDING FEDERALLY SPONSORED RESEARCH OR DEVELOPMENT

The electronic devices and certain components thereof were supported by a United States Government Cooperative Agreement No. 70NANBOH3033 awarded by the National Institute of Standards and Technology (NIST). The United States Government has certain rights relating to the devices and certain semiconductor components illustrated hereinafter.

CROSS-REFERENCE TO RELATED APPLICATIONS

U.S. Pat. No. 7,372,071, filed Apr. 6, 2006, on Functionalized Heteroacenes and Electronic Devices Generated Therefrom, by Yuning Li et al.

U.S. application Ser. No. 11/399,226, filed Apr. 6, 2006, on Functionalized Heteroacenes, by Yuning Li et al.

U.S. application Ser. No. 11/399,216, filed Apr. 6, 2006, on Polyacenes and Electronic Devices Generated Therefrom, by Yuning Li et al.

U.S. application Ser. No. 11/399,064, filed Apr. 6, 2006, on Heteroacene Polymers and Electronic Devices Generated Therefrom, by Yuning Li et al.

U.S. application Ser. No. 11/399,169, filed Apr. 6, 2006, on Ethynylene Acene Polymers and Electronic Devices Generated Therefrom, by Yuning Li et al.

U.S. application Ser. No. 11/399,091, filed Apr. 6, 2006, on Ethynylene Acene Polymers, by Yuning Li et al.

U.S. Pat. No. 7,449,715, filed Apr. 6, 2006, on Poly[bis (ethynyl)heteroacenes] and Electronic Devices Generated Therefrom, by Yuning Li et al.

U.S. application Ser. No. 11/399,141, filed Apr. 6, 2006, on Semiconductors and Electronic Devices Generated Therefrom, by Yiliang Wu et al.

U.S. application Ser. No. 11/399,230, filed Apr. 6, 2006, on Semiconductor Polymers, by Yiliang Wu et al.

U.S. application Ser. No. 11/398,941, filed Apr. 6, 2006, on Polydiazaacenes and Electronic Devices Generated Therefrom, by Yiliang Wu et al.

U.S. application Ser. No. 11/398,902, filed Apr. 6, 2006, on Polydiazaacenes, by Yiliang Wu et al.

U.S. application Ser. No. 11/399,246, filed Apr. 6, 2006, on Poly(alkynylthiophene)s, by Beng S. Ong et al.

U.S. application Ser. No. 11/399,092, filed Apr. 6, 2006, on Linked Arylamine Polymers and Electronic Devices Generated Therefrom, by Yuning Li et al.

U.S. application Ser. No. 11/399,065, filed Apr. 6, 2006, on Linked Arylamine Polymers, by Yuning Li et al.

Illustrated in U.S. application Ser. No. 11/011,678 filed Dec. 14, 2004 relating to indolocarbazole moieties and thin film transistor devices thereof.

Illustrated in U.S. application Ser. No. 11/167,512 filed Jun. 27, 2005 relating to indolocarbazole moieties and thin film transistor devices thereof.

Illustrated in U.S. Pat. No. 6,770,904 and copending application U.S. application Ser. No. 10/922,662, Publication No. 20050017311, are electronic devices, such as thin film transistors containing semiconductor layers of, for example, polythiophenes.

The disclosure of each of the above cross referenced applications and patent is totally incorporated herein by reference.

In aspects of the present disclosure, there may be selected the appropriate substituents, such as a suitable hydrocarbon, a heteroatom containing group, hydrogen, halogen, CN, $NO_2$, rings, number of repeating polymer units, number of groups, and the like as illustrated in the copending applications.

The appropriate components, processes thereof and uses thereof illustrated in the copending applications and above patent may be selected for the present invention in embodiments thereof.

BACKGROUND

The present disclosure is generally directed to poly(3-alkynylthiophene)s, substituted poly(3-alkynylthiophene)s, and uses thereof. More specifically, the present disclosure in embodiments is directed to a class of poly(alkynyl substituted thiophene)s selected as solution processable and substantially stable channel semiconductors in organic electronic devices, such as thin film transistors.

There are desired electronic devices, such as thin film transistors (TFTs), fabricated with poly(3-alkynylthiophene)s with excellent solvent solubility, which can be solution processable; and which devices possess mechanical durability and structural flexibility, characteristics which are desirable for fabricating flexible TFTs on plastic substrates. Flexible TFTs enable the design of electronic devices with structural flexibility and mechanical durability characteristics. The use of plastic substrates together with the poly(3-alkynylthiophene) component can transform the traditionally rigid silicon TFT into a mechanically more durable and structurally flexible TFT design. This can be of particular value to large area devices such as large-area image sensors, electronic paper and other display media. Also, the selection of poly(3-alkynylthiophene) TFTs for integrated circuit logic elements for low end microelectronics, such as smart cards, radio frequency identification (RFID) tags, and memory/storage devices, may enhance their mechanical durability, and thus their useful life span.

A number of semiconductor materials are not, it is believed, stable when exposed to air as they become oxidatively doped by ambient oxygen, resulting in increased conductivity. The result is large off-current and thus low current on/off ratio for the devices fabricated from these materials. Accordingly, with many of these materials, rigorous precautions are usually undertaken during materials processing and device fabrication to exclude environmental oxygen to avoid or minimize oxidative doping. These precautionary measures increase the cost of manufacturing therefore offsetting the appeal of certain semiconductor TFTs as an economical alternative to amorphous silicon technology, particularly for large area devices. These and other disadvantages are avoided or minimized in embodiments of the present disclosure.

REFERENCES

Regioregular polythiophenes, when selected as the semiconductor layer for thin film transistors (TFTs), are sensitive to air and unstable when exposed to oxygen, that is for example, to photoinduced oxidative doping in air, a disadvantage avoided or minimized with the thin film transistors disclosed herein.

Acenes, such as pentacenes and heteroacenes, are known to possess acceptable high filed effect mobility when used as channel semiconductors in TFTs. However, these materials are rapidly oxidized by, for example, atmospheric oxygen under light, and such compounds may not be considered processable at ambient conditions. Furthermore, when selected for TFTs, acenes have poor thin film formation characteristics and are substantially insoluble, thus they are essentially nonsolution processable; accordingly, such compounds have been mostly processed by vacuum deposition methods that result in high production costs, and which disadvantages are minimized with the TFTs generated with the poly(alkynylthiophene)s illustrated herein.

A number of organic semiconductor materials has been described for use in field-effect TFTs, which materials include organic small molecules, such as pentacene, see for example D. J. Gundlach et al., "Pentacene organic thin film transistors—molecular ordering and mobility", *IEEE Electron Device Lett., Vol.* 18, p. 87 (1997); oligomers, such as sexithiophenes or their variants, see for example reference F. Garnier et al., "Molecular engineering of organic semiconductors: Design of self-assembly properties in conjugated thiophene oligomers", *J. Amer. Chem. Soc., Vol.* 115, p. 8716 (1993), and poly(3-alkylthiophene), see for example reference Z. Bao et al., "Soluble and processable regioregular poly(3-hexylthiophene) for field-effect thin film transistor application with high mobility", *Appl. Phys. Lett. Vol.* 69, p 4108 (1996). Although organic material based TFTs generally provide lower performance characteristics than their conventional silicon counterparts, such as silicon crystals or polysilicon TFTs, they may nonetheless be sufficiently suitable for applications in areas where high mobility is not required.

Also, a number of known small molecule or oligomer-based TFT devices rely on difficult vacuum deposition techniques for fabrication. Vacuum deposition is selected primarily because these materials are either insoluble or their solution processing by spin coating, solution casting, or stamp printing does not generally provide uniform thin films.

Further, vacuum deposition may also involve the difficulties of achieving consistent thin film quality for large area format. Polymer TFTs, such as those fabricated from regioregular components of, for example, regioregular poly(alkylthiophene-2,5-diyl) by solution processes, while offering some mobility, suffer from their propensity towards oxidative doping in air. The TFTs fabricated from these materials in ambient conditions generally, it is believed, exhibit large off-current, very low current on/off ratios, and their performance characteristics degrade rapidly. For low cost TFT design with excellent characteristics, it is therefore of value to have a semiconductor material that is both stable and solution processable, and where its performance is not adversely affected by ambient oxygen, for example, TFTs generated with the poly(3-alkynylthiophene)s illustrated herein.

Illustrated in Huang, D. H., et al, *Chem. Mater.* 2004, 16, 1298-1303, are, for example, LEDS and field effect transistors based on certain phenothiaazines like poly(10-(2-ethylhexyl)phenothiaazine).

Illustrated in Zhu, Y., et al, *Macromolecules* 2005, 38, 7983-7991, are, for example semiconductors based on phenoxazine conjugated polymers like poly(10-hexylphenoxazine).

Additional references that may be of interest include U.S. Pat. Nos. 6,150,191; 6,107,117; 5,969,376; 5,619,357, and 5,777,070.

BRIEF DESCRIPTION OF THE DRAWINGS

Illustrated in FIGS. 1 to 4 are various representative embodiments of the present disclosure, and wherein a poly (3-alkynylthiophene), such as poly(3-decynylthiophene), is selected as the channel or semiconductor material in thin film transistor (TFT) configurations.

DESCRIPTION OF THE EXEMPLARY EMBODIMENTS

Figure 1:
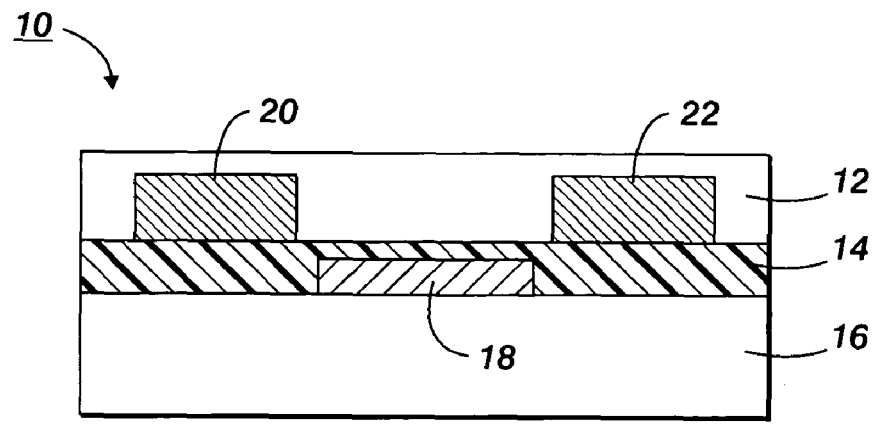

It is a feature of the present disclosure to provide a semiconductor, poly(3-alkynylthiophene), which is useful for microelectronic device applications, such as TFT devices.

It is another feature of the present disclosure to provide a poly(3-alkynylthiophene) with a band gap of from about 1 eV to about 3 eV as determined from the absorption spectra of thin films thereof, and which poly(3-alkynylthiophene) is suitable for use as TFT semiconductor channel layer materials.

In yet a further feature of the present disclosure there are provided poly(3-alkynylthiophene)s, which are useful as microelectronic components, and which poly(3-alkynylthiophene)s possess solubility of, for example, at least about 0.1 percent to about 95 percent by weight in common organic solvents, such as methylene chloride, tetrahydrofuran, toluene, xylene, mesitylene, chlorobenzene, and the like, and thus these components can be economically fabricated by solution processes such as spin coating, screen printing, stamp printing, dip coating, solution casting, jet printing, and the like.

Also, in yet another feature of the present disclosure there are provided novel poly(alkynylthiophene)s, and devices thereof, and which devices exhibit enhanced resistance to the adverse effects of oxygen, that is, these devices, it is believed, exhibit relatively high current on/off ratios, and their performance may not substantially degrade as rapidly as similar devices fabricated with regioregular poly(3-alkylthiophene-3,5-diyl) or with acenes.

Additionally, in a further feature of the present disclosure there is provided a class of novel regioregular poly(3-alkynylthiophene)s, with unique structural features which are conducive to molecular self-alignment under appropriate processing conditions, and which structural features also enhance the stability of device performance. Proper molecular alignment can permit higher molecular structural order in thin films, which can be important to efficient charge carrier transport, thus higher electrical performance.

Further, another feature of the present disclosure relates to regioregular poly(3-alkynylthiophene)s by replacing the alkyl of polythiophene with an alkynyl.

There are disclosed in embodiments, a poly(3-alkynylthiophene) and electronic devices thereof. Alkynyl like ethynyl refers in embodiments to, for example, a substituted ethynyl group in the poly(3-alkynylthiophene)s. Poly(3-alkynylthiophene) refers in embodiments to, for example, a polymer which is comprised of a repeat unit which is a thiophene with at least one pair of optionally substituted alkynyl like ethynyl groups.

More specifically, the present disclosure relates to poly (alkynylthiophene)s illustrated by or encompassed by Formula (I)

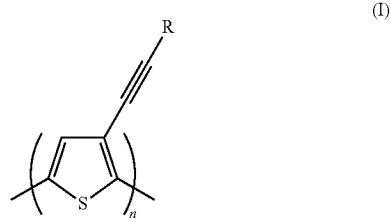

wherein R is a suitable hydrocarbon, such as alkyl, aryl, and the like, and n represents the number of repeating units, such as for example, n is a number of from about 2 to about 5,000, more specifically from about 10 to about 1,000, or from about 20 to about 100.

In embodiments, the repeat unit can be considered the important recurring unit of the polymer. The connection of the repeat units in the polymer may be identical, as is the situation with a regioregular polymer, or it may be dissimilar, as is the situation with a regiorandom polymer, and with respect primarily to the directional aspect. Whether a repeat unit A is considered the same type or a different type as another repeat unit B is independent of directional aspect or sense when repeat unit A and repeat unit B are in the polymer. For instance, regiorandom poly(3-hexylthiophene) is considered to have only one type of repeat unit.

In embodiments, a specific class of regioregular poly(3-alkynylthiophene)s is represented by the following formulas

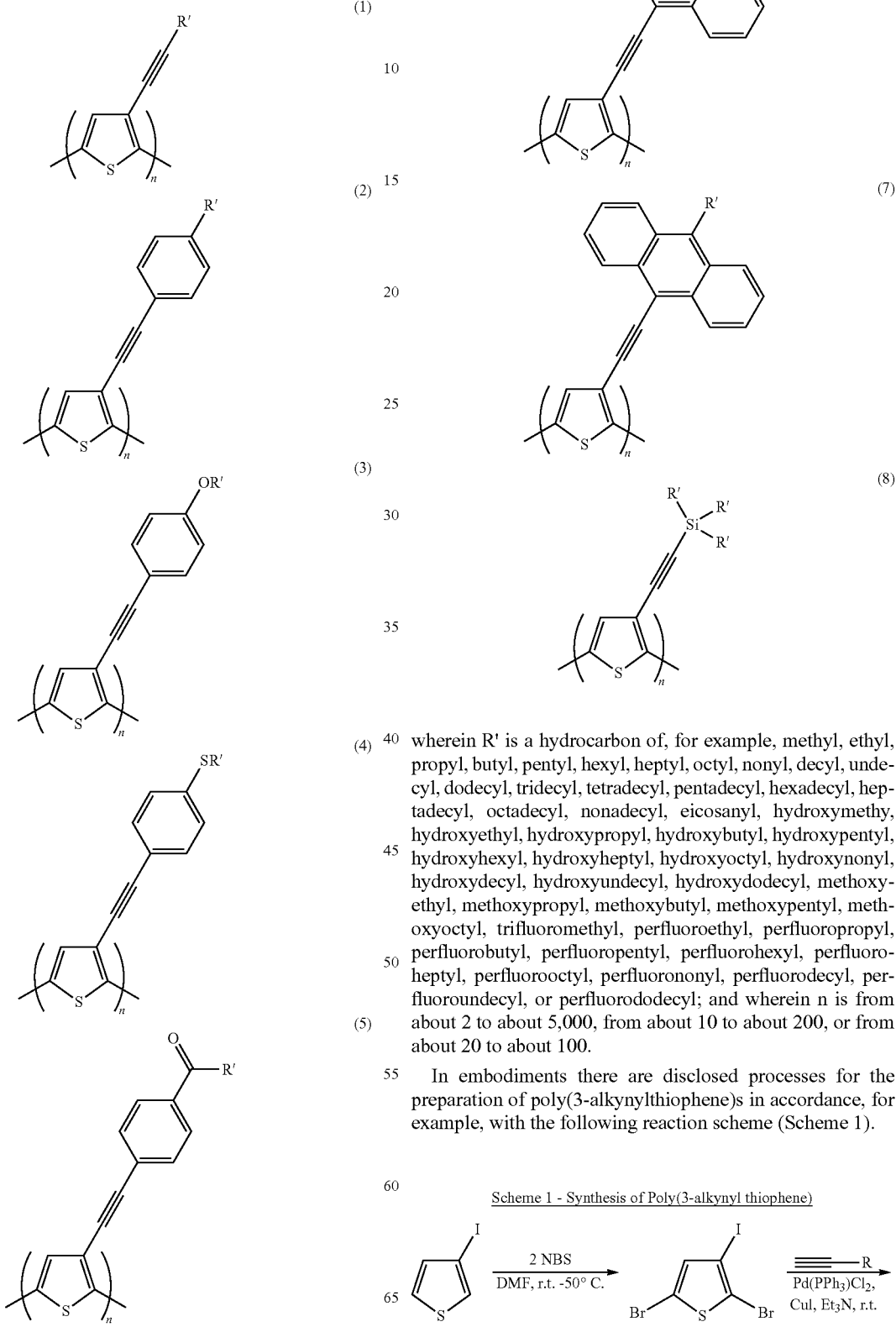

wherein R' is a hydrocarbon of, for example, methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanyl, hydroxymethy, hydroxyethyl, hydroxypropyl, hydroxybutyl, hydroxypentyl, hydroxyhexyl, hydroxyheptyl, hydroxyoctyl, hydroxynonyl, hydroxydecyl, hydroxyundecyl, hydroxydodecyl, methoxyethyl, methoxypropyl, methoxybutyl, methoxypentyl, methoxyoctyl, trifluoromethyl, perfluoroethyl, perfluoropropyl, perfluorobutyl, perfluoropentyl, perfluorohexyl, perfluoroheptyl, perfluorooctyl, perfluorononyl, perfluorodecyl, perfluoroundecyl, or perfluorododecyl; and wherein n is from about 2 to about 5,000, from about 10 to about 200, or from about 20 to about 100.

In embodiments there are disclosed processes for the preparation of poly(3-alkynylthiophene)s in accordance, for example, with the following reaction scheme (Scheme 1).

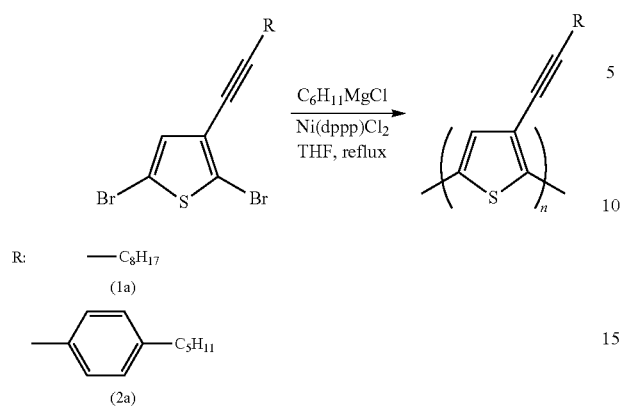

More specifically, 2,5-dibromo-3-iodothiophene is prepared via bromination of 3-iodothiophene (available from Aldrich) with about 2 molar equivalents of N-bromosuccinimide (NBS) in N,N-dimethylformamide (DMF) at room temperature, about 23° C. to about 26° C., and up to about 50° C. Thereafter, the 2,5-dibromo-3-ethynylthiophene, such as 2,5-dibromo-3-decynylthiophene or 2,5-dibromo-3-(4-pentylphenyl)thiophene, is prepared by reacting 2,5-dibromo-3-iodothiophene with the corresponding ethynyl compound, decyne compound of less than 5 percent or 0 to 5 percent, or 1-ethynyl-4-butylbenzene in the presence of catalytic amounts of dichlorobis(triphenylphosphine)palladium (II) (Pd(PPh$_3$)$_2$Cl$_2$ and copper (II) iodide (CuI) in triethylamine (Et$_3$N) at room temperature. Subsequently, the poly(3-ethynylthiophene), such as poly(3-decynylthiophene) (1a) or poly (3-(4-pentylphenyl)ethynylthiophene) (2a), is generated by adding about one molar equivalent of Grignard reagent, such as cyclohexylmagnesium chloride (C$_6$H$_{11}$MgCl), in the presence of [1,3-bis(diphenylphosphino)propane]dichloronickel (II) (Ni(dppp)Cl$_2$) in refluxing tetrahydrofuran (THF).

Examples of R substituents include alkyl with, for example, from about 1 to about 30, including from about 4 to about 18 carbon atoms (included throughout are numbers within the range, for example 4, 5, 6, 7, 8, 9, 10, 11, 12, 13, 14, 15, 16, 17 and 18), such as eithyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, or eicosanyl, and the like; aryl with from about 6 to about 54 carbon atoms, from about 6 to about 36 carbon atoms, from about 6 to about 24 carbon atoms, such as thienyl, phenyl, methylphenyl (tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, octadecylphenyl, and the like, inclusive, it is believed, of other suitable hydrocarbons not specifically described.

Specific heteroatom containing groups are known and include, for example, polyethers, trialkylsilyls, heteroaryls, and the like; and more specifically, thienyl, furyl and pyridiaryl. The hetero component can be selected from a number of known atoms like sulfur, oxygen, nitrogen, silicon, selenium, and the like.

Specific illustrative poly(3-alkynylthiophene) examples are

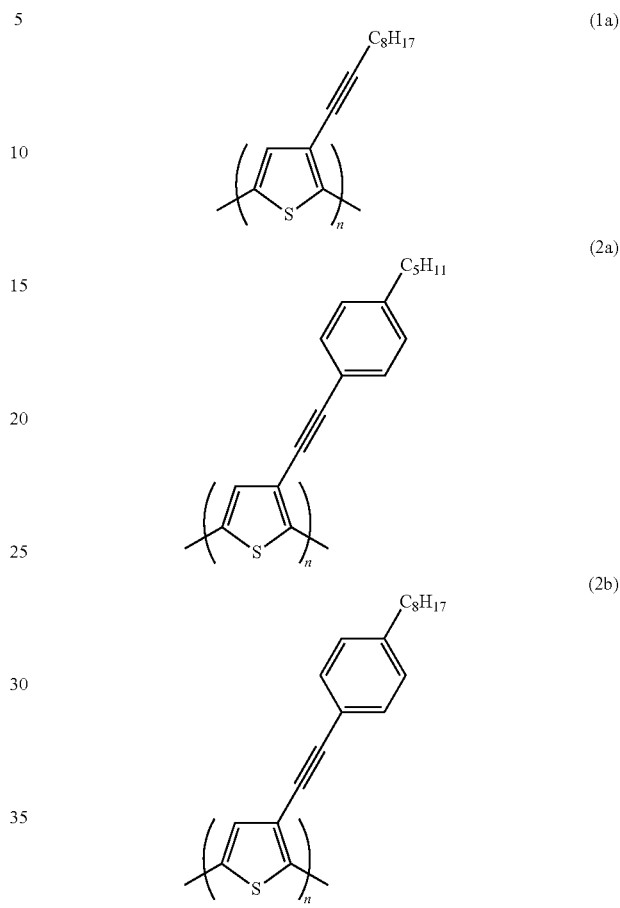

wherein n represents the number of repeating units in the polymer; and wherein n is from about 20 to about 100.

The poly(3-alkynylthiophene)s in embodiments are soluble or substantially soluble in common coating solvents, for example, in embodiments they possess a solubility of at least about 0.1, and more specifically, from about 0.5 percent to about 95 percent by weight in such solvents as methylene chloride, 1,2-dichloroethane, tetrahydrofuran, toluene, xylene, mesitylene, chlorobenzene, dichlorobenzene, and the like. Moreover, the poly(3-alkynylthiophene)s or substituted thiophenes of the present disclosure, when fabricated as semiconductor channel layers in TFT devices, can provide, it is believed, a stable conductivity of, for example, from about $10^{-9}$ S/cm to about $10^{-4}$ S/cm, and more specifically, from about $10^{-8}$ S/cm to about $10^{-5}$ S/cm as determined by conventional four-probe conductivity measurements.

It is believed that the poly(3-alkynylthiophene)s illustrated herein when fabricated from solutions as thin films of, for example, from about 10 nanometers to about 500 nanometers, or from about 100 to about 300 nanometers in thickness can be more stable in ambient conditions than similar devices fabricated from acenes like pentacene or certain poly(alkylthiophene)s. When unprotected, the aforementioned poly(3-alkynylthiophene) materials and devices can be, it is believed, generally stable for a number of weeks rather than days or hours as is the situation with poly(3-alkylthiophene-2,5-diyl) after exposure to ambient oxygen, thus the devices fabricated from the poly(3-alkynylthiophene) in embodiments of the present disclosure can provide higher current on/off ratios, and their performance characteristics may not substantially change as rapidly as pentacene or poly(3-alkylthiophene-2, 5-diyl) when no rigorous procedural precautions have been taken to exclude ambient oxygen during material preparation, device fabrication, and evaluation. The poly(3-alkynylthiophene)s stability of the present disclosure in embodiments against oxidative doping, particularly for low cost device manufacturing, does not usually have to be handled in an inert atmosphere, and the processes thereof are, therefore, simpler and more cost effective, and the fabrication thereof can be applied to large scale production processes.

Aspects of the present disclosure relate to an electronic device comprising a semiconductive material of Formula (I)

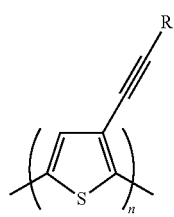

(I)

wherein R is a suitable hydrocarbon or a heteroatom containing group; and n represents the number of repeating units; a thin film transistor device comprised of a substrate, a gate electrode, a gate dielectric layer, a source electrode and a drain electrode, and in contact with the source/drain electrodes and the gate dielectric layer a semiconductor layer of Formula (I)

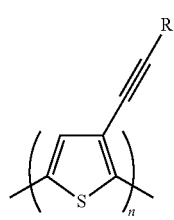

(I)

and wherein R is a suitable hydrocarbon or a heteroatom containing group; and n represents the number of repeating units; an electronic device comprising a semiconductive material wherein said device is a thin film transistor, and said semiconductive material is selected from the group consisting of those of Formulas (1) through (8)

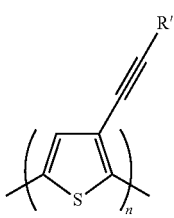

(1)

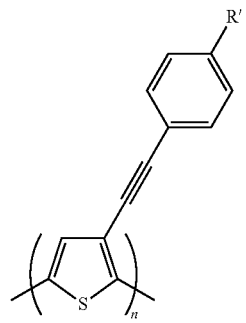

(2)

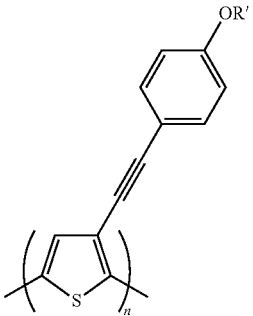

(3)

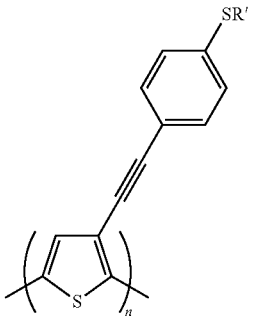

(4)

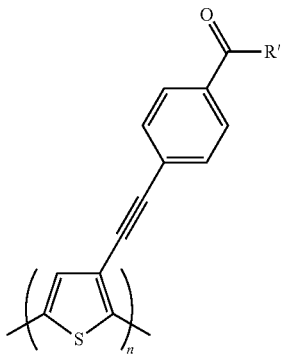

(5)

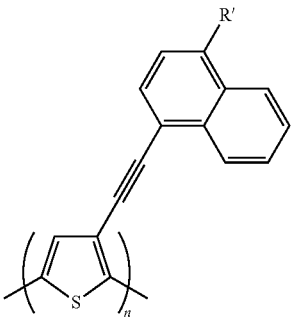

(6)

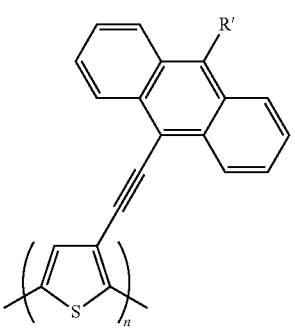

(7)

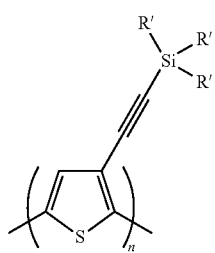

(8)

wherein R' is a hydrocarbon of alkyl, aryl, and the like, and more specifically, is methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosanyl, hydroxymethy, hydroxyethyl, hydroxypropyl, hydroxybutyl, hydroxypentyl, hydroxyhexyl, hydroxyheptyl, hydroxyoctyl, hydroxynonyl, hydroxydecyl, hydroxyundecyl, hydroxydodecyl, methoxyethyl, methoxypropyl, methoxybutyl, methoxypentyl, methoxyoctyl, trifluoromethy, perfluoroethyl, perfluoropropyl, perfluorobutyl, perfluoropentyl, perfluorohexyl, perfluoroheptyl, perfluorooctyl, perfluorononyl, perfluorodecyl, perfluoroundecyl, or perfluorododecyl; and wherein n is from about 2 to about 200; a polymer of the following formula

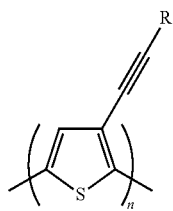

(I)

wherein R is a suitable hydrocarbon or a heteroatom containing group; and n represents the number of repeating units; a TFT device wherein the substrate is a plastic sheet of a polyester, a polycarbonate, or a polyimide; the gate source and drain electrodes are each independently comprised of gold, nickel, aluminum, platinum, indium titanium oxide, or a conductive polymer, and the gate dielectric is a dielectric layer comprised of silicon nitride or silicon oxide; a TFT device wherein the substrate is glass or a plastic sheet; said gate, source and drain electrodes are each comprised of gold, and the gate dielectric layer is comprised of the organic polymer poly(methacrylate), or poly(vinyl phenol); a device wherein the poly(3-alkynylthiophene) layer is formed by solution processes of spin coating, stamp printing, screen printing, or jet printing; a device wherein the gate, source and drain electrodes, the gate dielectric, and semiconductor layers are formed by solution processes of spin coating, solution casting, stamp printing, screen printing, or jet printing; and a TFT device wherein the substrate is a plastic sheet of a polyester, a polycarbonate, or a polyimide, and the gate, source and drain electrodes are fabricated from the organic conductive polymer polystyrene sulfonate-doped poly(3,4-ethylene dioxythiophene), or from a conductive ink/paste compound of a colloidal dispersion of silver in a polymer binder, and the gate dielectric layer is organic polymer or inorganic oxide particle-polymer composite; and device or devices include electronic devices such as TFTs.

DETAILED DESCRIPTION OF THE FIGURES

In FIG. 1 there is schematically illustrated a TFT configuration 10 comprised of a substrate 16, in contact therewith a metal contact 18 (gate electrode), and a layer of an insulating dielectric layer 14 with the gate electrode having a portion thereof or the entire gate in contact with the dielectric layer 14 with the gate electrode having a portion thereof or the entire gate in contact with the dielectric layer 14 on top of which layer 14 two metal contacts, 20 and 22 (source and drain electrodes), are deposited. Over and between the metal contacts 20 and 22 is the semiconductive polymer, such as poly (3-decynylthiophene), layer 12. The gate electrode can be included in the substrate, in the dielectric layer, and the like throughout.

Figure 2:
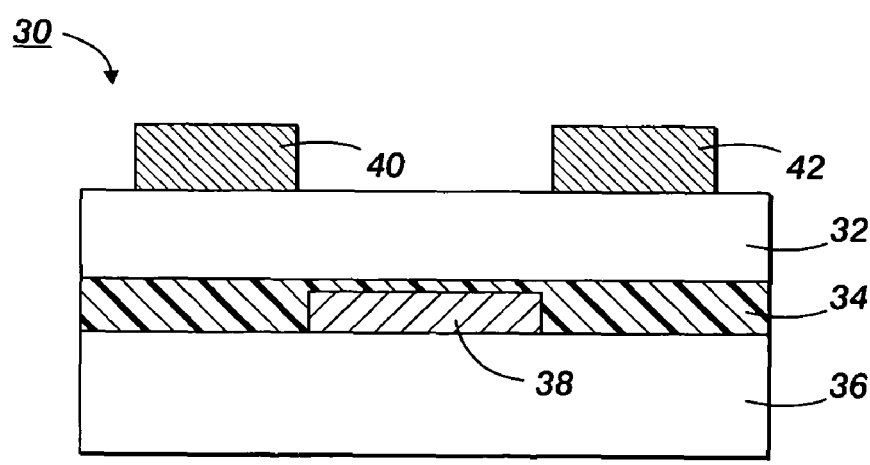

FIG. 2 schematically illustrates another TFT configuration 30 comprised of a substrate 36, a gate electrode 38, a source electrode 40, and a drain electrode 42, an insulating dielectric layer 34, and a poly(3-decynylthiophene) semiconductor layer 32.

Figure 3:
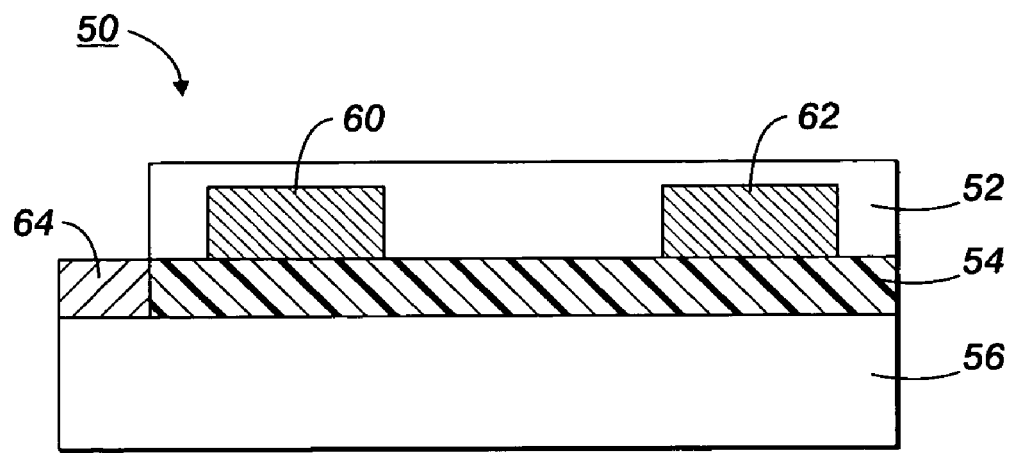

FIG. 3 schematically illustrates a further TFT configuration 50 comprised of a heavily n-doped silicon wafer 56, which can act as a gate electrode, a thermally grown silicon oxide dielectric layer 54, a poly(3-decynylthiophene) semiconductor layer 52, and a source electrode 60 and a drain electrode 62; and a gate electrode contact 64.

Figure 4:
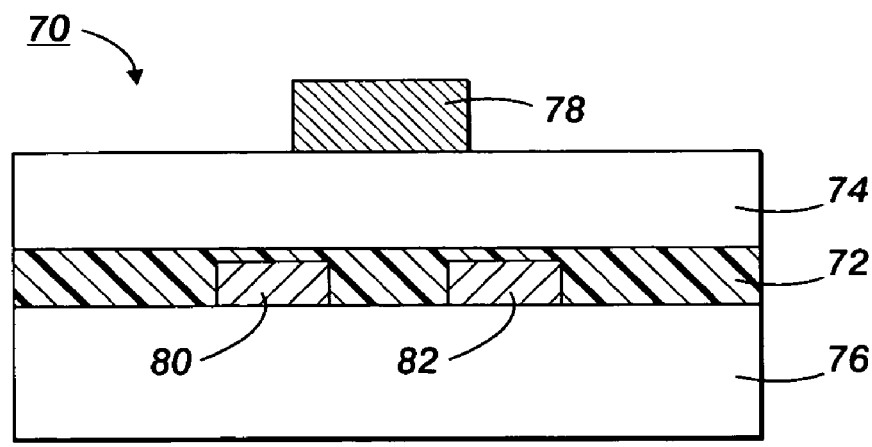

FIG. 4 schematically illustrates a TFT configuration 70 comprised of a substrate 76, a gate electrode 78, a source electrode 80, a drain electrode 82, a poly(3-decynylthiophene) semiconductor layer 72, and an insulating dielectric layer 74.

Also, other devices not disclosed, especially TFT devices, are envisioned, reference for example known TFT devices.

In some embodiments of the present disclosure, an optional protecting layer may be incorporated on top of each of the transistor configurations of FIGS. 1, 2, 3 and 4. For the TFT configuration of FIG. 4, the insulating dielectric layer 74 may also function as a protecting layer.

In embodiments, and with further reference to the present disclosure and the Figures, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 micrometers, especially for a flexible plastic substrate, and from about 1 to about 10 millimeters for a rigid substrate such as glass or silicon.

The insulating dielectric layer, which can separate the gate electrode from the source and drain electrodes, and in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers, such as polyester, polyimide, epoxy resin and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$·F/cm$^2$.

Situated, for example, between and in contact with the dielectric layer and the source/drain electrodes is the active semiconductor layer comprised of the poly(3-alkynylthiophene)s illustrated herein, and wherein the thickness of this layer is generally, for example, about 10 nanometers to about 1 micrometer, or about 40 to about 100 nanometers. This layer can generally be fabricated by the solution processing of the poly(3-alkynylthiophene)s of the present disclosure.

The gate electrode can be a thin metal film, a conducting polymer film, a conducting film generated from a conducting ink or paste, or the substrate itself (for example heavily doped silicon). Examples of gate electrode materials include, but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as Electrodag available from Acheson Colloids Company, and silver filled electrically conductive thermoplastic ink available from Noelle Industries, and the like. The gate layer can be prepared by vacuum evaporation, sputtering of metals or conductive metal oxides, coating from conducting polymer solutions or conducting inks or dispersions by spin coating, casting or printing. The thickness of the gate electrode layer is, for example, from about 10 nanometers to about 10 micrometers, and a specific thickness is, for example, from about 10 to about 200 nanometers for metal films, and about 1 to about 10 micrometers for polymer conductors.

The source and drain electrode layer can be fabricated from materials which provide a low resistance ohmic contact to the semiconductor layer. Typical materials suitable for use as source and drain electrodes include those of the gate electrode materials such as gold, nickel, aluminum, platinum, conducting polymers, and conducting inks. Typical thickness of this layer is about, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally about +10 volts to about −80 volts is applied to the gate electrode.

Other known materials not recited herein for the various components of the TFT devices of the present disclosure can also be selected in embodiments.

Although not desiring to be limited by theory, it is believed that the alkynyl like the ethynyl groups functions primarily to minimize or avoid instability upon exposure to oxygen thereby increasing the oxidative stability of the poly(3-alkynylthiophene)s in solution under ambient conditions and the R substituents, such as alkyl, permit the solubility of these polymers in common solvents, such as ethylene chloride, tetrahydrofuran, toluene, chlorobenzene, dichlorobenzene, and the like.

The following Examples are provided, it being understood that these Examples are intended to be illustrative only, and the disclosure is not intended to be limited to the materials, conditions, or process parameters recited. All percentages and parts are by weight unless otherwise indicated. Identification of the products generated can be accomplished by a number of known methods including HNMR in CdCl$_3$.

EXAMPLE I

Synthesis of Poly(3-decynylthiophene) (1a):
1) 2,5-Dibromo-3-iodothiophene
3-Iodothiophene (4.20 grams, 20 mmol) was dissolved in DMF (50 milliliters) under argon at room temperature. N-Bromosuccinimide (NBS) (7.83 grams, 40 mmol) in DMF (50 milliliters) was added to the above solution with stirring. The resulting mixture was then stirred at room temperature for 1 hour, and the reaction temperature was raised to 50° C. and held at this temperature for another 3 to 4 hours. After removing the DMF solvent, the liquid resulting was dissolved in ethylacetate and washed with water three times. The organic phase formed was dried over anhydrous magnesium sulfate (MgSO$_4$), and the solvent was removed. Further purification was conducted by using column chromatography on a silica gel with hexane as an eluent. 2,5-Dibromo-3-iodothiophene was thus obtained as a colorless liquid. Yield: 7 grams (95 percent).

2) 2,5-Dibromo-3-decynylthiophene
To a solution of the above prepared 2,5-dibromo-3-iodothiophene (3.43 grams, 9.3 mmol) and 1-decyne (1.45 grams, 10.5 mmol) in triethylamine (50 milliliters) were added dichlorobis(triphenylphosphine)palladium (II) (0.28 gram, 0.4 mmol) and copper(I) iodide (38 milligrams, 0.2 mmol) at 0° C. under argon. The reaction mixture was stirred at 0° C. for 6 hours and at room temperature for 20 hours under argon. After evaporation of the solvent, the product was purified by column chromatography on silica gel using hexane as eluent. 2,5-Dibromo-3-decynylthiophene was thus obtained as a colorless liquid was. Yield: 3.32 grams (94 percent).

$^1$H NMR (in CDCl$_3$): 6.88 (s, 1H), 2.41 (t, J=7.0 Hz, 2H), 1.60 (m, 2H), 1.45 (m, 2H), 1.29 (br, 10H), 0.88 (t, J=6.4 Hz, 3H).

3) Poly(3-decynylthiophene) (1a)
A dry 100 milliliter three-neck flask was charged with the above prepared 2,5-dibromo-3-decynylthiophene (1.89 grams, 5 mmol) and anhydrous THF (50 milliliters). Then, 2M cyclohexylmagnesium chloride in diethyl ether (2.5 milliliters, 5 mmol) was added to the flask via syringe. The reaction mixture was allowed to stir for 30 minutes at room temperature followed by the addition of Ni(dppp)Cl$_2$ (41 milligrams, 0.075 mmol). The reaction mixture was then allowed to reflux for 12 hours. The reaction mixture was then allowed to cool down to room temperature, precipitated into methanol (200 milliliters), and filtered. The polymer resulting was purified by Soxhlet extraction in sequence with methanol (48 hours), acetone (24 hours), and hexane (24 hours). Finally, the residue solid was dissolved with chloroform. After removing the solvent, the dark purple solid was dried under vacuum to yield poly(3-decynylthiophene) (1a). Yield: 0.50 gram (46 percent).

$^1$H NMR (in CDCl$_3$): 7.09-7.33 (br), 2.56, 1.73, 1.51, 1.29, 0.87.

GPC (with polystyrene as standard): $M_n$=10,300; $M_w/M_n$=2.18.

Device Fabrication and Evaluation:

There was selected a top-contact thin film transistor configuration as schematically illustrated, for example, in FIG. 3. The device was comprised of an n-doped silicon wafer with a thermally grown silicon oxide layer of a thickness of about 110 nanometers thereon. The wafer functioned as the gate electrode while the silicon oxide layer acted as the gate dielectric and had a capacitance of about 30 nF/cm$^2$ (nanofarads/square centimeter) as measured with a capacitor meter. The silicon wafer was first cleaned with isopropanol, argon plasma, and air dried. Then, the clean substrate was immersed in a 0.1 M solution of octyltrichlorosilane (OTS8) in toluene at 60° C. for 20 minutes. Subsequently, the wafer was washed with toluene, isopropanol and air dried. Poly(3-decynylthiophene) (1a) dissolved in dichlorobenzene at a concentration of 0.3 percent by weight was used to deposit the semiconductor layer. The solution was first filtrated through a 1 micrometer syringe filter, and then spin-coated on to the OTS8 silicon substrate at 1,000 rpm for 120 seconds at room temperature resulting in a thin film with thickness of about 20 to about 50 nanometers. After being dried in a vacuum oven at 80° C. for 5 to 10 hours, gold source and drain electrodes of about 50 nanometers were deposited on top of the semiconductor layer by vacuum deposition through a shadow mask with various channel lengths and widths, thus creating a series of transistors of various dimensions.

The evaluation of the generated field-effect transistor performance was accomplished in a black box at ambient conditions using a Keithley 4200 SCS semiconductor characterization system. The carrier mobility, μ, was calculated from the data in the saturated regime (gate voltage, $V_G$<source-drain voltage, $V_{SD}$) according to Equation (1)

$$I_{SD}=C_i\mu(W/2L)(V_G-V_T)^2 \quad (1)$$

where $I_{SD}$ is the drain current at the saturated regime, W and L are, respectively, the semiconductor channel width and length, Ci is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}$=0.

Another property of a field-effect transistor is its current on/off ratio. This is the ratio of the saturation source-drain current at the accumulation regime to the source-drain current at the depletion regime.

The transfer and output characteristics of the devices revealed that poly(3-decynylthiophene) (1a) is a p-type semiconductor. Evaluating about 5 transistors with a dimension of W=5,000 μm and L=90 μm resulted in mobilities of from about 1 to about 3, and more specifically, from 0.001 to about 0.008 cm$^2$/Vs (volts per second)

Mobility: 0.008 cm$^2$V$^{-1}$s$^{-1}$

On/off ratio: 10$^6$.

EXAMPLE II

Synthesis of Poly(3-(4-pentylphenyl)ethynylthiophene) (2a):
1) 2,5-Dibromo-3-(4-pentylphenyl)ethynylthiophene To a solution of 2,5-dibromo-3-iodothiophene (3.52 grams, 9.57 mmol) and 1-ethynyl-4-pentylbenzene (1.65 grams, 9.57 mmol) in triethylamine (50 milliliters) were added dichlorobis(triphenylphosphine)palladium (II) (0.28 gram, 0.4 mmol) and copper(I) iodide (38 milligrams, 0.2 mmol) at 0° C. under argon. The resulting reaction mixture was stirred at 0° C. for 6 hours and at room temperature for 20 hours under argon. After evaporation of the solvent, the product obtained was purified by column chromatography on a silica gel using hexane as eluent. 2,5-Dibromo-3-(4-pentylphenyl)ethynylthiophene was obtained as a colorless liquid was. Yield: 3 grams (73 percent).

$^1$H NMR (in CDCl$_3$): 7.44 (d, J=8.3 Hz, 2H), 7.16 (d, J=8.3 Hz, 2H), 7.00 (s, 1H), 2.61 (t, J=7.7 Hz, 2H), 1.61 (m, 2H), 1.32 (m, 4H), 0.89 (t, J=6.8 Hz, 3H).

2) Poly(3-(4-pentylphenyl)ethynylthiophene) (2a)

A dry 100 milliliter three-neck flask was charged with the above prepared 2,5-dibromo-3-(4-pentylphenyl)ethynylthiophene (2.06 grams, 5 mmol) and anhydrous THF (50 milliliters). Then, 2M cyclohexylmagnesium chloride in diethyl ether (2.5 milliliters, 5 mmol) was added to the flask via a syringe. The reaction mixture resulting was allowed to stir for 30 minutes at room temperature followed by the addition of Ni(dppp)Cl$_2$ (41 milligrams, 0.075 mmol). The reaction mixture was then allowed to reflux for 12 hours. The reaction mixture was then allowed to cool down to room temperature, precipitated into methanol (200 milliliters), and filtered. The polymer generated was purified by Soxhlet extraction in sequence with methanol (48 hours), acetone (24 hours), and hexane (24 hours). Finally, the residue solid was dissolved with chloroform. After removing solvent, the dark purple solid was dried under vacuum to yield poly(3-(4-pentylphenyl)ethynylthiophene) (2a). Yield: 0.20 gram (16 percent).

$^1$H NMR (in CDCl$_3$): 7.41, 7.02, 2.51, 1.56, 1.32, 0.90.

GPC (with polystyrene as standard): $M_n$=3,600; $M_w/M_n$=1.41.

Device Fabrication and Evaluation:

OTFT devices using poly(3-(4-pentylphenyl)ethynylthiophene) (2a) as a semiconductor layer were fabricated and evaluated similarly by repeating the device fabrication of Example I. The transfer and output characteristics of the device revealed that poly(3-(4-pentylphenyl)ethynylthiophene) (2a) is a p-type semiconductor. Evaluating five (5) transistors with a dimension of W=5,000 μm and L=90 μm there were obtained similar desirable characteristics of the devices of Example I.

Mobility: 0.001 cm$^2$V$^{-1}$s$^{-1}$

On/off ratio: 10$^6$.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others. Unless specifically recited in a claim, steps or components of claims should not be implied or imported from the specification or any other claims as to any particular order, number, position, size, shape, angle, color, or material.

What is claimed is:

1. An electronic device comprising a homopolymer of Formula (2a) or (2b):

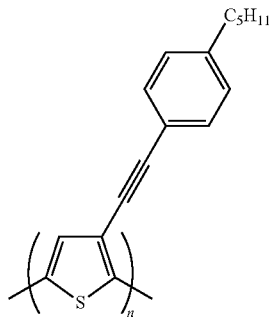

(2a)

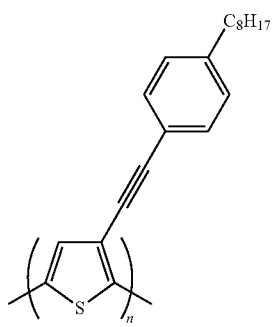

(2b)

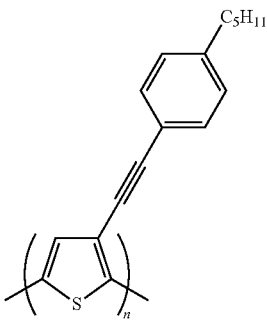

(2a)

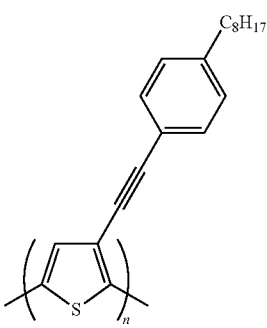

(2b)

wherein n represents the number of repeating units wherein the homopolymer forms a solution-processed stable channel layer having a mobility of at least $0.001$ cm$^2$V$^{-1}$S$^{-1}$ and an on/off ratio of at least $10^6$.

2. A device in accordance with claim 1 wherein n represents a number of from about 10 to about 500.

3. A device in accordance with claim 1 wherein n represents a number of from about 20 to about 100.

4. A device in accordance with claim 1 wherein said device is a thin film transistor.

5. A thin film transistor device comprised of a substrate, a gate electrode, a gate dielectric layer, a source electrode and a drain electrode, and in contact with the source/drain electrodes and the gate dielectric layer a semiconductor layer comprising a homopolymer of Formula (2a) or (2b):

wherein n represents the number of repeating units wherein the homopolymer in the semiconductor layer forms a solution-processed stable channel layer having a mobility of at least $0.001$ cm$^2$V$^{-1}$S$^{-1}$ and an on/off ratio of at least $10^6$.

6. A device in accordance with claim 5 wherein said substrate is a plastic sheet of a polyester, a polycarbonate, or a polyimide; said gate, source and drain electrodes are each independently comprised of silver, gold, nickel, aluminum, chromium, platinum, indium titanium oxide, or a conductive polymer, and said gate dielectric layer is comprised of inorganic nitrides, inorganic oxides, or organic polymers.

7. A device in accordance with claim 5 wherein said substrate is glass or a plastic sheet; said gate, source and drain electrodes are each independently comprised of silver, gold, or chromium; and said gate dielectric layer is comprised of poly(methacrylate), polysiloxane, or poly(vinyl phenol); and wherein said semiconductor layer is deposited by solution processes of spin coating, stamp printing, screen printing, or jet printing.

* * * * *

UNITED STATES PATENT AND TRADEMARK OFFICE
CERTIFICATE OF CORRECTION

PATENT NO. : 8,049,205 B2  
APPLICATION NO. : 11/398931  
DATED : November 1, 2011  
INVENTOR(S) : Beng S. Ong et al.

Page 1 of 1

It is certified that error appears in the above-identified patent and that said Letters Patent is hereby corrected as shown below:

In the Specification

Column 1, line 10, after "Cooperative Agreement No.", please delete "70NANBOH3033" and insert -- 70NANB0H3033 --.

Signed and Sealed this
Tenth Day of September, 2013

Teresa Stanek Rea
*Acting Director of the United States Patent and Trademark Office*